United States Patent
Tuers et al.

(10) Patent No.: US 10,014,060 B2
(45) Date of Patent: Jul. 3, 2018

(54) MEMORY SYSTEM AND METHOD FOR REDUCING READ DISTURB ERRORS

(71) Applicant: SanDisk Technologies Inc., Plano, TX (US)

(72) Inventors: Daniel E. Tuers, Kapaa, HI (US); Abhijeet Manohar, Bangalore (IN); Nicholas Thomas, Dundee (GB); Jonathan Hsu, Newark, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/675,107

(22) Filed: Mar. 31, 2015

(65) Prior Publication Data

US 2016/0225461 A1 Aug. 4, 2016

(30) Foreign Application Priority Data

Jan. 30, 2015 (IN) .......................... 310/MUM/2015

(51) Int. Cl.
*G11C 16/34* (2006.01)
*G11C 11/56* (2006.01)
*G11C 16/26* (2006.01)

(52) U.S. Cl.
CPC ...... *G11C 16/3427* (2013.01); *G11C 11/5642* (2013.01); *G11C 16/26* (2013.01); *G11C 16/3431* (2013.01)

(58) Field of Classification Search
CPC . G11C 16/3427; G11C 16/26; G11C 16/3431; G11C 16/349

USPC ....................................... 365/185.09, 185.22
See application file for complete search history.

(56) References Cited

U.S. PATENT DOCUMENTS

| 8,332,576 | B2* | 12/2012 | Chu | G06F 12/0246 |
| | | | | 711/103 |
| 2005/0013165 | A1* | 1/2005 | Ban | G06F 11/1068 |
| | | | | 365/185.2 |
| 2008/0055989 | A1* | 3/2008 | Lee | G06F 11/1068 |
| | | | | 365/185.09 |
| 2009/0172254 | A1* | 7/2009 | Chen | G06F 12/0246 |
| | | | | 711/103 |
| 2009/0327591 | A1* | 12/2009 | Moshayedi | G06F 11/1441 |
| | | | | 711/103 |
| 2011/0038203 | A1* | 2/2011 | Camp | G11C 16/3418 |
| | | | | 365/185.02 |
| 2013/0279250 | A1* | 10/2013 | Park | G11C 16/28 |
| | | | | 365/185.03 |
| 2013/0346805 | A1* | 12/2013 | Sprouse | G11C 16/3418 |
| | | | | 714/42 |

* cited by examiner

*Primary Examiner* — Alexander Sofocleous
*Assistant Examiner* — Alfredo Bermudez Lozada
(74) *Attorney, Agent, or Firm* — Brinks Gilson & Lione

(57) ABSTRACT

A memory system and method for reducing read disturb errors are disclosed. In one embodiment, a memory system is provided comprising a plurality of blocks of memory and a controller. The controller is configured to detect a read disturb error in a block, identify data that caused the read disturb error, and move the data that caused the read disturb error to a block with a higher read endurance. This can be done by assigning read counters to blocks to determine frequently-read data, and storing that data in a separate block until it is less frequently read and will likely not cause additional read disturb errors.

30 Claims, 13 Drawing Sheets

Unaligned long sequential

Multiple Aggressors in the same block

Several blocks of hot data exist

|   | Duration of Measurement | Threshold |
|---|---|---|
| A | 1 Sec | 10K / (24*60*60) |
| B | 1 Min | 10K / (24*60) |
| C | 1 Hour | 10K / (24) |
| D | 1 Day | 10K |
FIG. 10
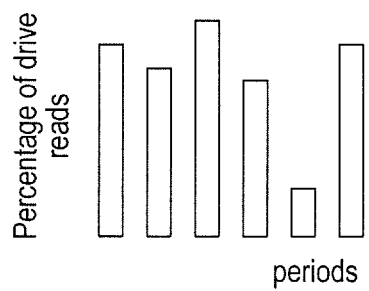
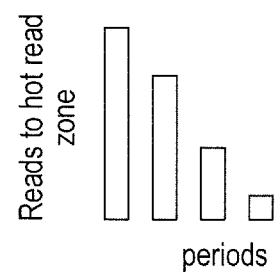
FIG. 11

MEMORY SYSTEM AND METHOD FOR REDUCING READ DISTURB ERRORS

PRIORITY

This application claims priority to India Patent Application No. 310/MUM/2015, filed on Jan. 30, 2015, entitled "Memory System and Method for Reducing Read Disturb Errors," the entire disclosure of which is hereby incorporated by reference.

BACKGROUND

In memory systems with non-volatile memory, such as NAND Flash memory, reading a word line in a block of memory can cause errors in data stored in neighboring word lines by changing the stored voltage. This effect is known as "read disturb." Because a read disturb error occurs in neighboring word lines, there is no indication when reading a given word line that the read to that word line caused a read disturb error in a neighboring word line. Various techniques have been developed for attempting to directly or indirectly detect read disturb errors. For example, when a given word line is read, the memory system can also read neighboring word lines to determine if the number of read errors in that neighboring word line exceeds a threshold, which would indicate that the neighboring word line was read disturbed. As another example (referred to as "read patrol"), the memory system can randomly or serially read word lines to look for errors. As yet another example, the memory system can count the number of reads to each block, and when the number of reads to a given block exceeds a threshold, the memory system can assume that a read disturb error may have likely occurred in the block.

Regardless of the detection technique used, when a read disturb error is found or assumed in a block, the memory system can "scrub" the block (i.e., move the data from the block to a new block (error correcting, as necessary), and erase the old block and put it into the pool of free blocks). Moving the data to the new block removes the deleterious effects of read disturb by setting the stored voltage to the proper amount.

Overview

Embodiments of the present invention are defined by the claims, and nothing in this section should be taken as a limitation on those claims.

By way of introduction, the below embodiments relate to a memory system and method for reducing read disturb errors. In one embodiment, a memory system detects a read disturb error in a level one block. The memory system moves data stored in the level one block to a level two block and monitors read accesses to the level two block to determine what data in the level two block is frequently read. The memory system then moves the data that was determined to be frequently read from the level two block to a level three block and monitors read accesses to the data in the level three block to determine if the data in the level three block is read less frequently. In response to determining that the data in the level three block is read less frequently, the memory system moves the data from the level three block to a level one block.

In another embodiment, a memory system is provided comprising a plurality of blocks of memory and a controller. The controller is configured to detect a read disturb error in a block, identify data that caused the read disturb error, and move the data that caused the read disturb error to a block with a higher read endurance.

In yet another embodiment, a memory system is provided comprising a plurality of blocks of memory, a plurality of read counters, and a read disturb module. The read disturb module is configured to detect a read disturb error in a first block, move data from the first block to a second block, assign read counters to the second block to identify hot read data, move the hot read data from the second block to a third block, assign read counters to the third block to determine when the hot read data becomes cold read data, and move the cold read data from the third block to another block.

Other embodiments are possible, and each of the embodiments can be used alone or together in combination. Accordingly, various embodiments will now be described with reference to the attached drawings.

BRIEF DESCRIPTION OF THE DRAWINGS

FIG. 10 is a chart of an embodiment showing duration measurement and threshold.

FIG. 11 are graphs illustrating reads to a hot read zone and percentage of drive reads of an embodiment.

DETAILED DESCRIPTION OF THE PRESENTLY PREFERRED EMBODIMENTS

As mentioned in the background section above, reading a word line in a block of memory can cause errors in data stored in neighboring word lines by changing the stored voltage. This effect is known as "read disturb." Various techniques have been developed for attempting to directly or indirectly detect read disturb errors, and when a read disturb error is found or assumed in a block, the memory system can "scrub" the block (i.e., move the data from the block to a new block (error correcting, as necessary), and erase the old block and put it into the pool of free blocks). Because a write of data sets the stored voltage to the proper amount in the memory cells of the new block (i.e., the write refreshes the programmed state), moving the data to the new block removes the deleterious effects of read disturb. However, if the data is frequently accessed, there will be many reads of the data in the new block, which can cause the new block to also experience read disturb errors and need to be scrubbed. So, even though scrubbing the original block addressed the immediate read disturb concern, it does not address the broader problem of what caused that concern in the first place. The following embodiments can be used to address this broader problem.

Before turning to these and other embodiments, the following paragraphs provide a discussion of exemplary memory systems that can be used with these embodiments. Of course, these are just examples, and other suitable types of storage modules can be used.

Figure 1A:
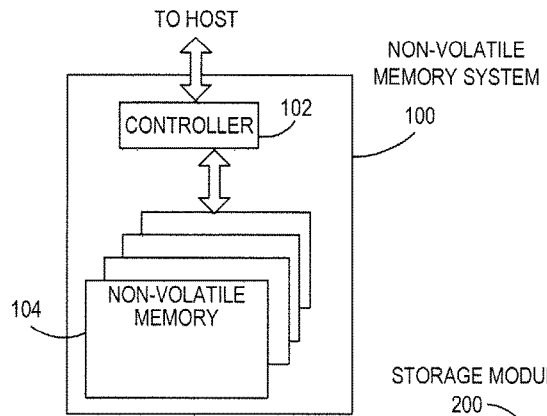
FIG. 1A is a block diagram of a non-volatile memory system of an embodiment.
Figure 1B:
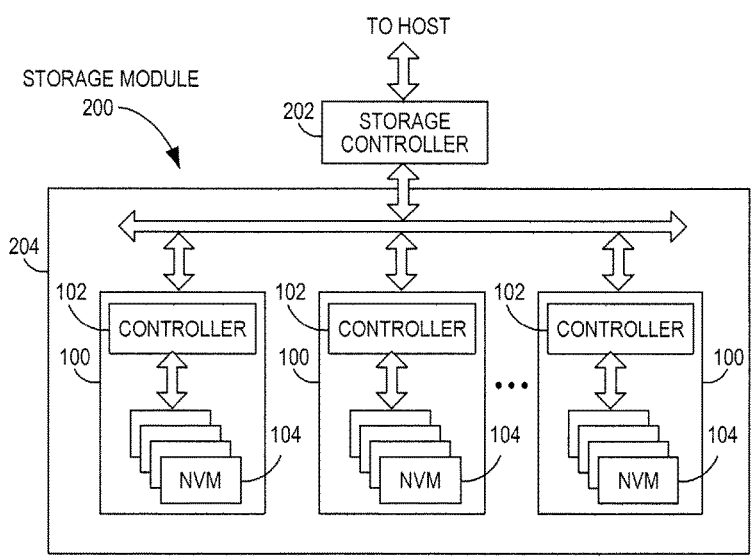
FIG. 1B is a block diagram illustrating an exemplary storage module of an embodiment.
Figure 1C:
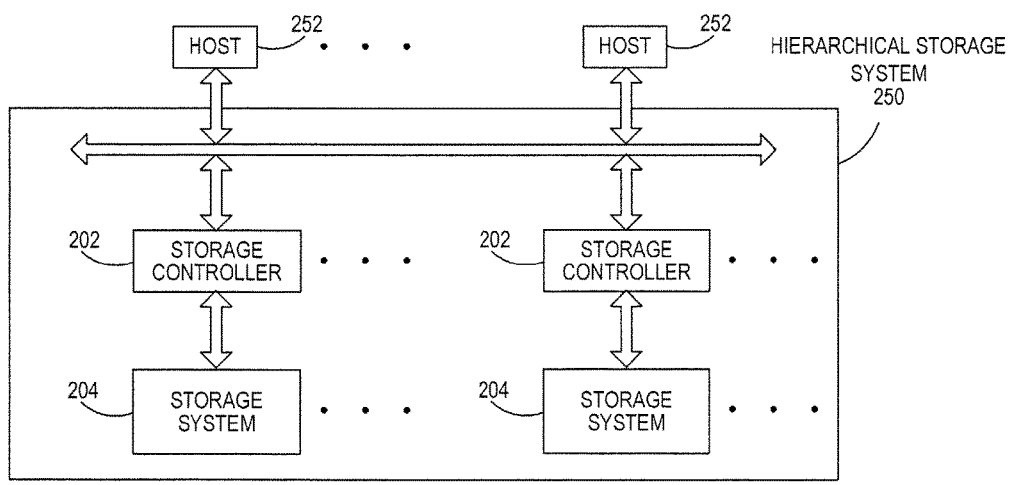
FIG. 1C is a block diagram illustrating a hierarchical storage system of an embodiment.

Memory systems suitable for use in implementing aspects of these embodiments are shown in FIGS. 1A-1C. FIG. 1A is a block diagram illustrating a non-volatile memory system according to an embodiment of the subject matter described herein. Referring to FIG. 1A, non-volatile memory system 100 includes a controller 102 and non-volatile memory that may be made up of one or more non-volatile memory die 104. As used herein, the term die refers to the collection of non-volatile memory cells, and associated circuitry for managing the physical operation of those non-volatile memory cells, that are formed on a single semiconductor substrate. Controller 102 interfaces with a host system and transmits command sequences for read, program, and erase operations to non-volatile memory die 104.

The controller 102 (which may be a flash memory controller) can take the form of processing circuitry, a microprocessor or processor, and a computer-readable medium that stores computer-readable program code (e.g., firmware) executable by the (micro)processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address.) The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. The memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system.

Although, in the example illustrated in FIG. 1A, non-volatile memory system 100 (sometimes referred to herein as a storage module) includes a single channel between controller 102 and non-volatile memory die 104, the subject matter described herein is not limited to having a single memory channel. For example, in some NAND memory system architectures (such as those shown in FIGS. 1B and 1C), 2, 4, 8 or more NAND channels may exist between the controller and the NAND memory device, depending on controller capabilities. In any of the embodiments described herein, more than a single channel may exist between the controller and the memory die, even if a single channel is shown in the drawings.

FIG. 1B illustrates a storage module 200 that includes plural non-volatile memory systems 100. As such, storage module 200 may include a storage controller 202 that interfaces with a host and with storage system 204, which includes a plurality of non-volatile memory systems 100. The interface between storage controller 202 and non-volatile memory systems 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

FIG. 1C is a block diagram illustrating a hierarchical storage system. A hierarchical storage system 250 includes a plurality of storage controllers 202, each of which controls a respective storage system 204. Host systems 252 may access memories within the storage system via a bus interface. In one embodiment, the bus interface may be an NVMe or fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
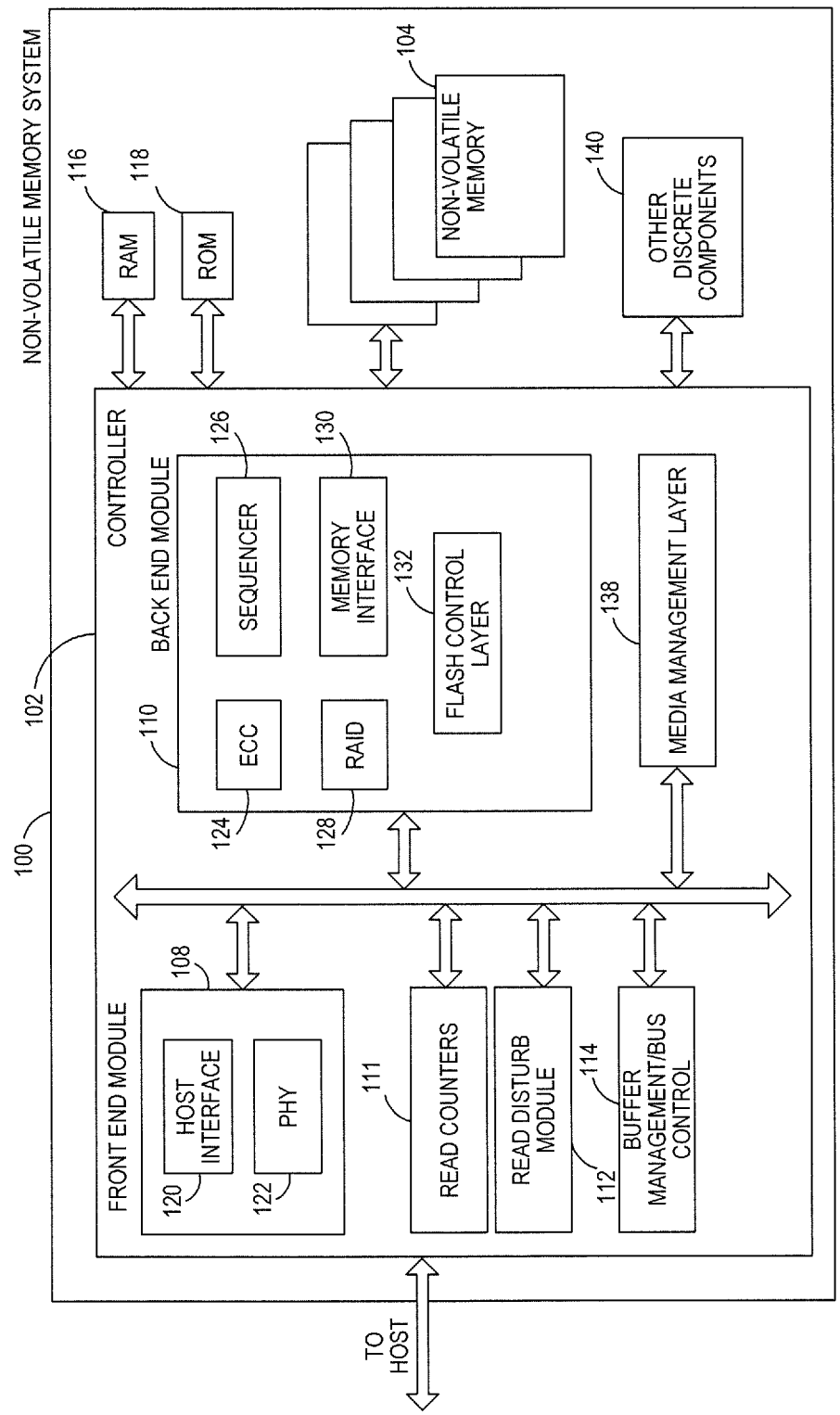
FIG. 2A is a block diagram illustrating exemplary components of the controller of the non-volatile memory system illustrated in FIG. 1A according to an embodiment.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail. A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example. Modules of the controller 102 may include read counters 111 and read disturb module 112. As explained in more detail below, the read counters 111 and the read disturb module 112 can be used to reduce read disturb errors.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the memory device 104. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

Additional components of system 100 illustrated in FIG. 2A include media management layer 138, which performs wear leveling of memory cells of non-volatile memory die 104. System 100 also includes other discrete components 140, such as external electrical interfaces, external RAM, resistors, capacitors, or other components that may interface with controller 102. In alternative embodiments, one or more of the physical layer interface 122, RAID module 128, media management layer 138 and buffer management/bus controller 114 are optional components that are not necessary in the controller 102.

Figure 2B:
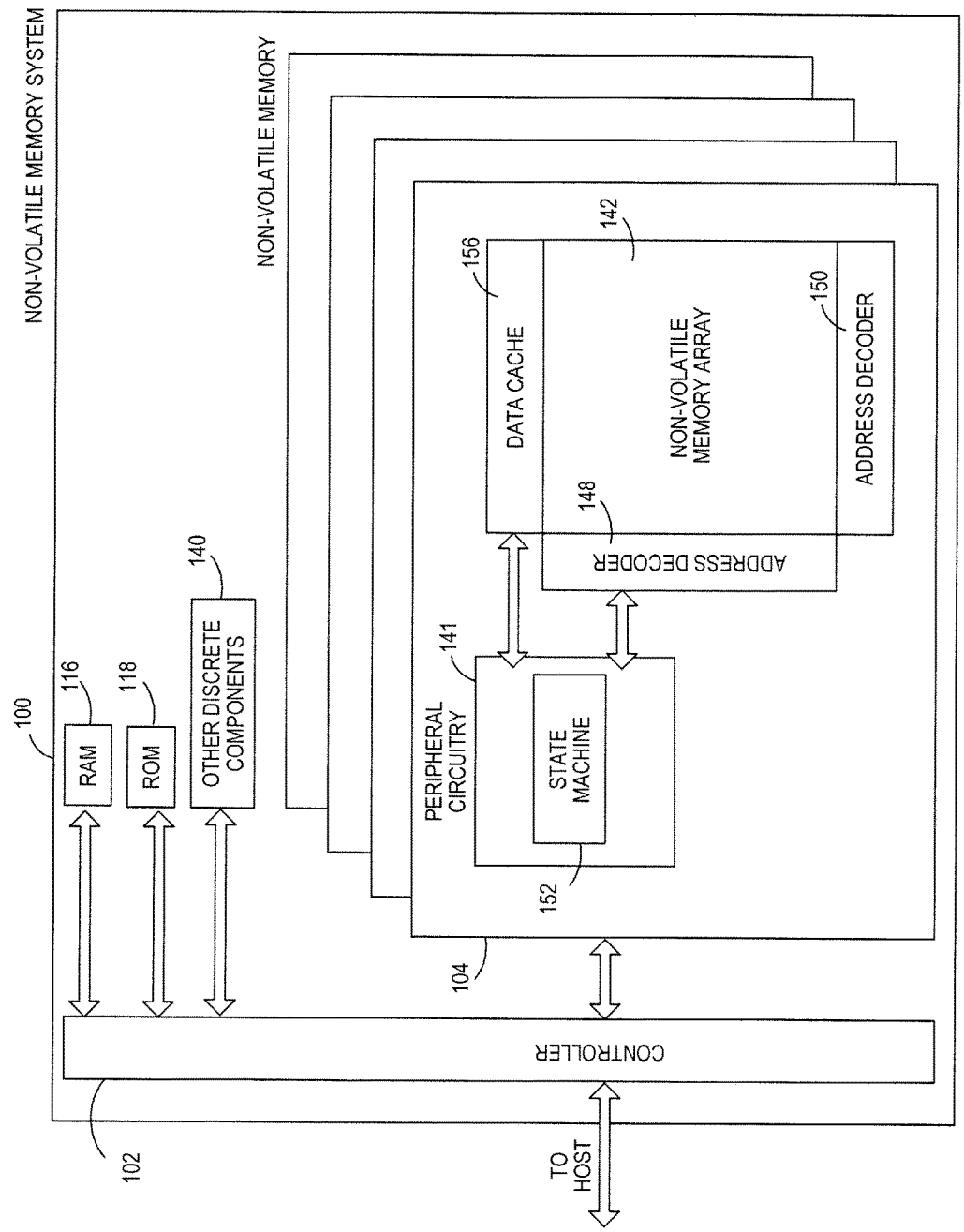
FIG. 2B is a block diagram illustrating exemplary components of the non-volatile memory of the non-volatile memory storage system illustrated in FIG. 1A according to an embodiment.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 152 that provides status information to controller 102. Non-volatile memory die 104 further includes a data cache 156 that caches data.

As mentioned above, in memory systems with non-volatile memory, such as NAND Flash memory, reading a word line in a block of memory can cause errors in data stored in neighboring word lines by changing the stored voltage. This effect is known as "read disturb." FIGS. 3A-3F illustrate this effect through various examples. These examples show a plurality of blocks of memory, where each block of memory has an array of a plurality of word lines and bit lines. In one embodiment, a block is the smallest erasable unit of memory, although reads and writes can be performed on a smaller level of granularity (e.g., a page, where four or eight pages are in a word line, in one embodiment). The plurality of blocks can be located on one memory die or across multiple memory dies. FIGS. 3A-3F show the plurality of blocks being logically grouped together in a "metablock." In one embodiment, blocks in a metablock can be written to and/or read in parallel.

FIGS. 3A-3F use the terms "aggressor" and "victim." "Aggressor" refers to the word line that is being read, and "victim" refers to the word line that is read disturbed because of the aggressor. The victim is read disturbed based on the physics of the memory architecture. Specifically, in one embodiment, a block is an array of word lines and bit lines. To read data out of a word line, the word line is charged to a certain voltage (e.g., 20V), and the other word lines are charged to a smaller voltage (e.g., 10 V). Even though the other word lines are not being read, they need to be charged in order to activate the bit line intersecting the word line that is being read. Over time, this smaller voltage wears out the other word lines and causes the read disturb errors. The word line being read is not adversely affected because it is activated at a high voltage, and any errors in the data can be corrected using ECC (error correction code) correction that is typically part of the read process.

Figure 3A:
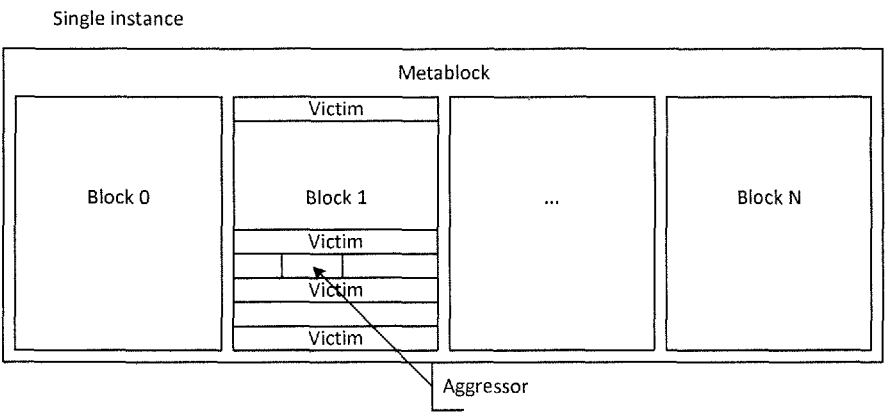
FIG. 3A is a diagram of a single instance read disturb of an embodiment.

Turning now to the examples, FIG. 3A shows a single instance of a read disturb error. In this example, only part of a word line is being read (e.g., a 2K or 4K ECC page (a page with data and ECC bits covering the data)). However, the entire word line needs to be charged, as the entire word line needs to be sensed even though only a part of the word line is eventually transferred out. This causes the entirety of the two neighboring word lines to be victims. Although not as much of a victim, the first and last word lines are also victims, as they are close to the source and drain.

Figure 3B:
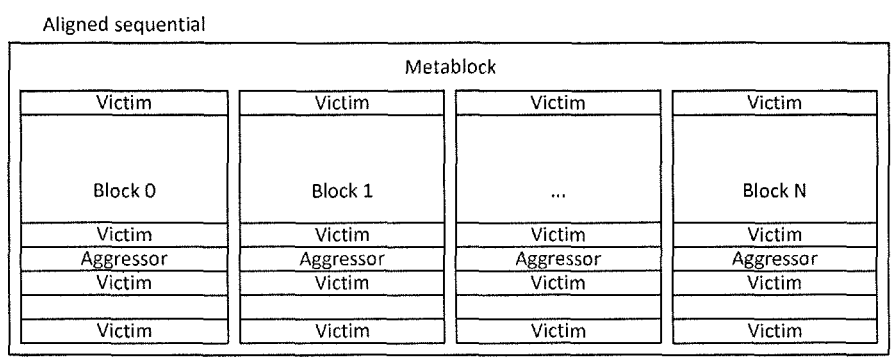
FIG. 3B is a diagram of an aligned sequential read disturb of an embodiment.
Figure 3C:
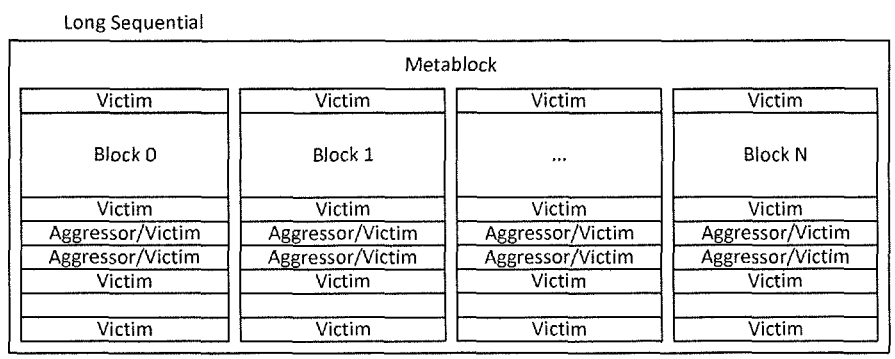
FIG. 3C is a diagram of a long sequential read disturb of an embodiment.
Figure 3D:
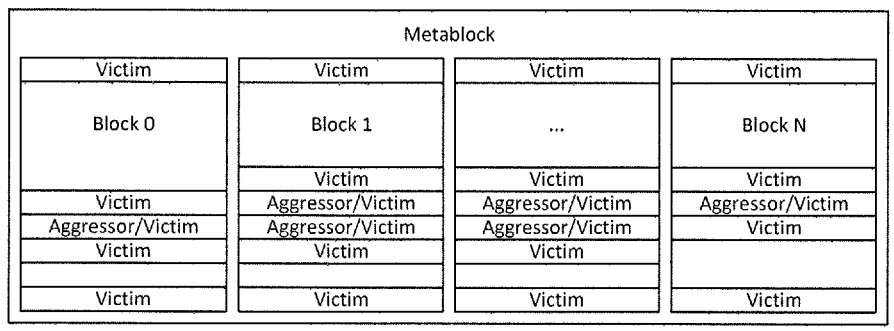
FIG. 3D is a diagram of an unaligned long sequential read disturb of an embodiment.
Figure 3E:
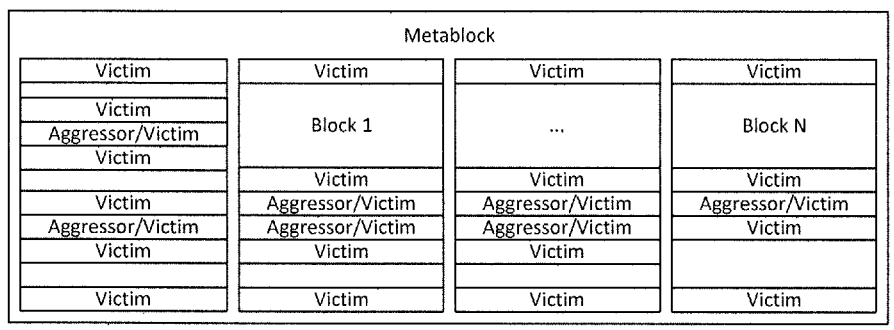
FIG. 3E is a diagram of multiple read disturb aggressors and victims in the same block of an embodiment.
Figure 3F:
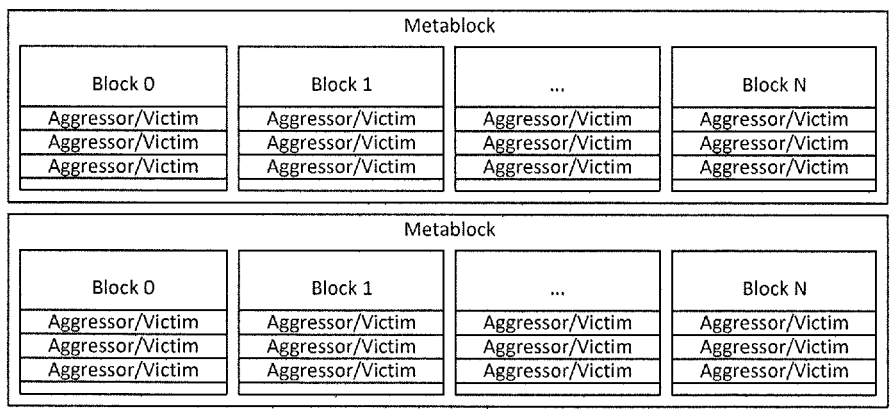
FIG. 3F is a diagram of an embodiment in which all the word lines are aggressors and victims.

FIG. 3B shows an aligned sequential read disturb. In this example, word lines across all of the blocks in the metablock are being read (as a "metapage"). As in FIG. 3A, the read word lines are the aggressors, the neighboring word lines are victims, and the first and last word lines are also victims, but not as much as the neighboring word lines. FIG. 3C shows a long sequential read disturb, where two neighboring stripes of word lines are being read. The two neighboring stripes of word lines are both aggressors and victims, as each of them is the aggressor when read but the victim when the other one is read. As in FIGS. 3A and 3B, the victims are also the immediate neighboring word lines, and, to a lesser extent, the first and last word lines. FIG. 3D shows an unaligned long sequential read disturb, where reads to word lines that are not aligned with each other across the blocks cause different word lines to be victims. FIG. 3E shows multiple read disturb aggressors and victims in the same block, and FIG. 3F shows an example where the read stripe spans several word lines (such as when there are several blocks of frequently-accessed data), making them all aggressors and victims.

As seen by these examples, reads to a localized zone of the memory can cause undetected disturbances in neighboring word lines within a block. Because a read disturb error occurs in neighboring word lines, there is no indication when reading a given word line that the read caused a read disturb error or where the error occurred. Various techniques have been developed for attempting to directly or indirectly detect read disturb errors. For example, when a given word line is read, the memory system can also read neighboring word lines (e.g., pseudo randomly or periodically, with the periodicity dependent on the number of allowed reads) to determine if the number of read errors in that neighboring word lines exceeds a threshold (e.g., greater than 75% of the amount of errors that the ECC engine can correct), which would indicate that the neighboring word line was read disturbed. However, this approach can add additional power and latency to host operations. (Examples of hosts include, but are not limited to, a mobile phone, a tablet computer, a digital media player, a game device, a personal digital assistant (PDA), a mobile (e.g., notebook, laptop) personal computer (PC), or a book reader.) Also, reading the neighboring word lines can contribute to the read disturb problem of the block, since reading the neighboring word lines causes them to become aggressors.

As another example (referred to as "read patrol"), the memory system can randomly or serially read word lines to look for correctable errors that could have been caused by read disturbs. However, because read patrol is not performed in conjunction with a read and does not target neighboring word lines, this technique may not be as effective as the technique discussed above. Further, read patrol may not be able to distinguish between a data retention problem (i.e., over time, the memory cells drift to 0 volts) and read disturbs. Additionally, this technique uses extra background power, may not find read disturb errors in time or at all (depending on the amount of background/idle time provided), and can take a significant amount of time to get coverage of the entire memory due to the strong locality of the read disturb effect. Additionally, read patrol, because it is reading word lines and disturbing neighbors, can itself contribute to the very problem it is trying to solve.

As yet another example, the memory system can uses block read counters to count the number of reads to each block, and when the number of reads to a given block exceeds a threshold, the memory system can assume that a read disturb error may have likely occurred in the block. This technique consumes a fair amount of memory space (e.g., 2-4 bytes per block (assuming one counter, and there can be more) multiplied by the number of blocks in the memory system). For example, in a solid-state drive (SSD), there can be 256K blocks, which can equate to 512 KB-1 MB of space for block read counters. Also, since a block counter only counts reads to the block and not to localized reads to a particular word line in the block, this technique can be overly pessimistic and indicates a read disturb problem when there is, in fact, not a problem.

Regardless of the detection technique that is used, when a read disturb error is found or assumed in a block, the memory system can "scrub" the block (i.e., move the data from the block to a new block (error correcting, as necessary), and erase the old block and put it into the pool of free blocks). Because a write of data sets the stored voltage to the proper amount in the memory cells of the new block (i.e., the write refreshes the programmed state), moving the data to the new block removes the deleterious effects of read disturb. However, if the data is frequently accessed, there will be many reads of the data in the new block, which can cause the new block to experience read disturb errors and need to be scrubbed. So, even though scrubbing the original block addresses the immediate read disturb concern, it does not address the broader problem of what caused that concern in the first place. The following embodiments can be used to address this broader problem.

In general, these embodiments use three different "levels" of blocks. Here, "level" does not refer to a spatial relationship (i.e., one level of blocks being above the other) but rather to a designation of different blocks for different purposes, and the term "set" will sometimes be used instead of "level" in this context. The blocks in the first, second, and/or third levels of blocks can be the same type of memory technology (e.g., all multi-level cell (MLC) blocks) or different types of memory technology (e.g., the first and second levels can contain MLC blocks, while the third level contains single-level cell (SLC) blocks, or the first level can contain MLC blocks, while the second and third levels contain SLC blocks, etc.).

In one embodiment, the first level of blocks are the "common" blocks of the memory system and can be from a general pool of available blocks. The second level of blocks are those blocks that contain more read counters than the first level of blocks (the first level may or may not contain any read counters). As will be discussed in more detail below, rather than permanently associating a read counter with a given block, the memory system 100 (e.g., the controller 102 generally or the read disturb module 112 specifically) can dynamically associate read counters with different blocks. In this way, a given block may be a level one block at some times and a level two block at other times (when the memory system 100 allocates the read counters to that block), and vice versa. Because read counters use resources in the memory system 100, there will typically be far fewer level two blocks (e.g., 5-10 blocks) that level one blocks. The third level of blocks are block were data can be stored in a way that makes the data less susceptible to read disturb errors than if stored in the first level of blocks.

In general, when a level one block needs to be scrubbed due to a read disturb error, instead of copying the data to another level one block, the data is copied to a level two block. Unlike the level one block which may have very few (e.g., one), if any, read counters assigned to it, the level two block has many read counters assigned to it (e.g., in one embodiment, a read counter for every smallest readable unit in the block). In this way, the level two block can be used to determine what particular data in the block is being read very frequently and causing the read disturb error. Again, this is different from a level one block, which, if it has a read counter, can just indicate that the block in general is being read frequently—not what particular data in the block is being read frequently. With this knowledge, the memory system 100 can copy the frequently-read data to a level three block, which can withstand the high frequency of reads better than a level one block. As it did in the level two block, the memory system can monitor the data in the level three block (using the same or different number of read counters) to determine when the read activity of the data has dropped down to a level where it is safe to move the data back to a level one block.

Figure 4:
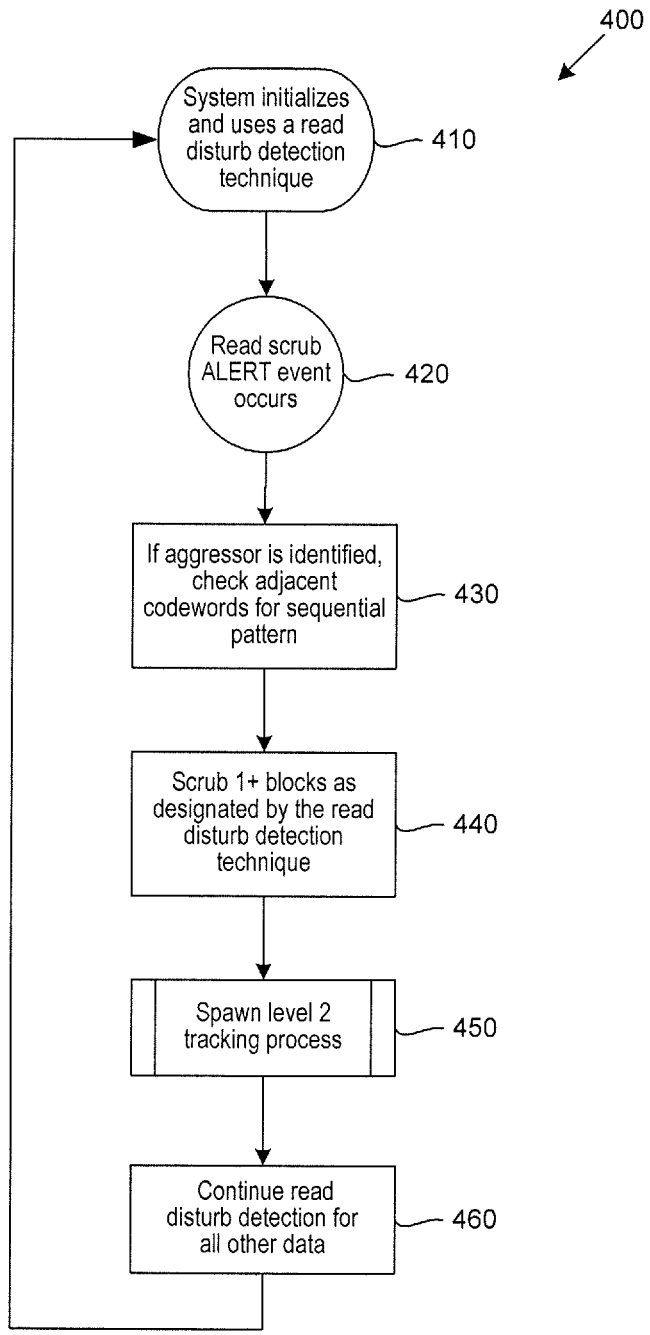
FIG. 4 is a flow chart of a method of an embodiment for reducing read disturb errors.
Figure 5:
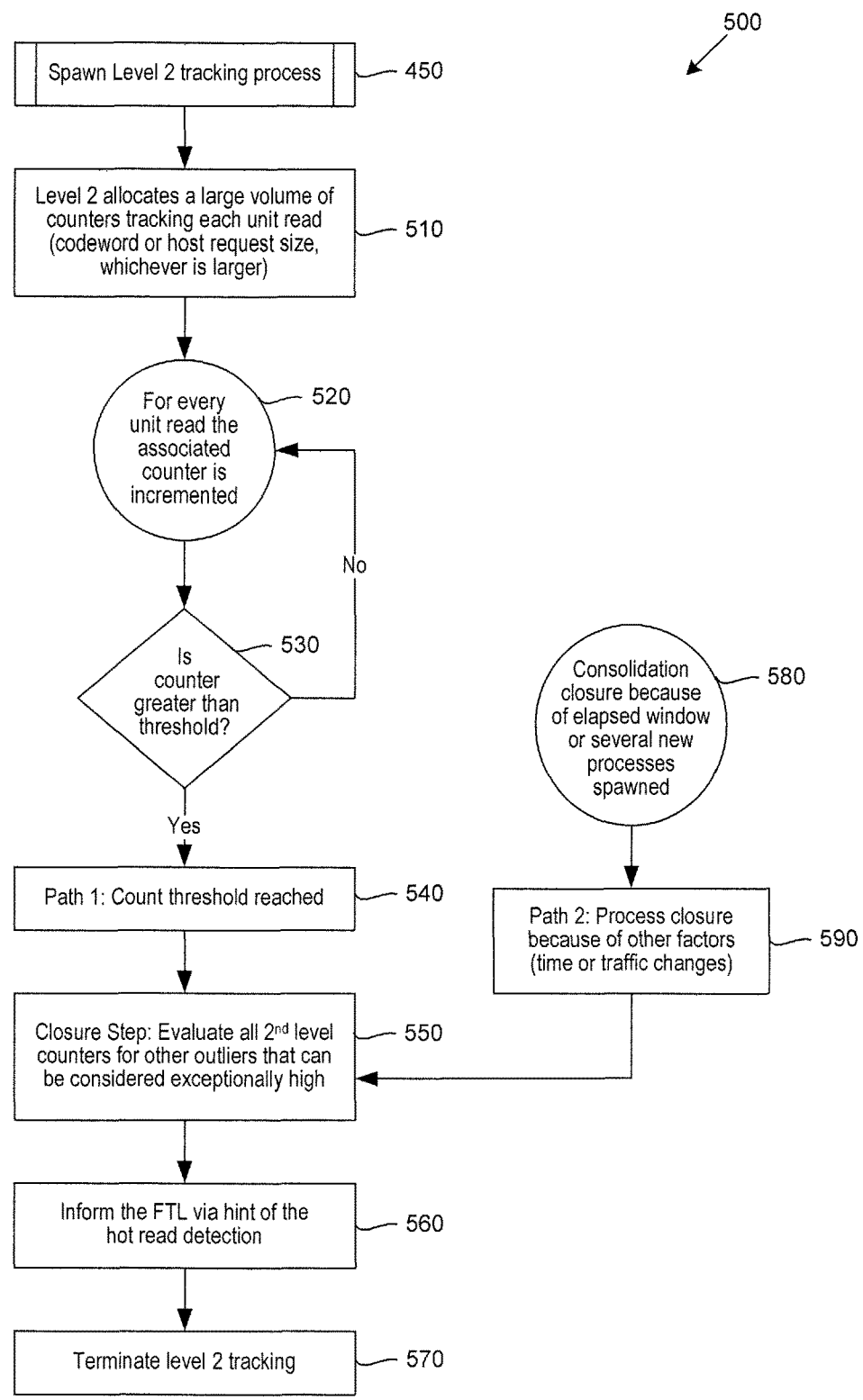
FIG. 5 is a flow chart of a tracking process of an embodiment.
Figure 6:
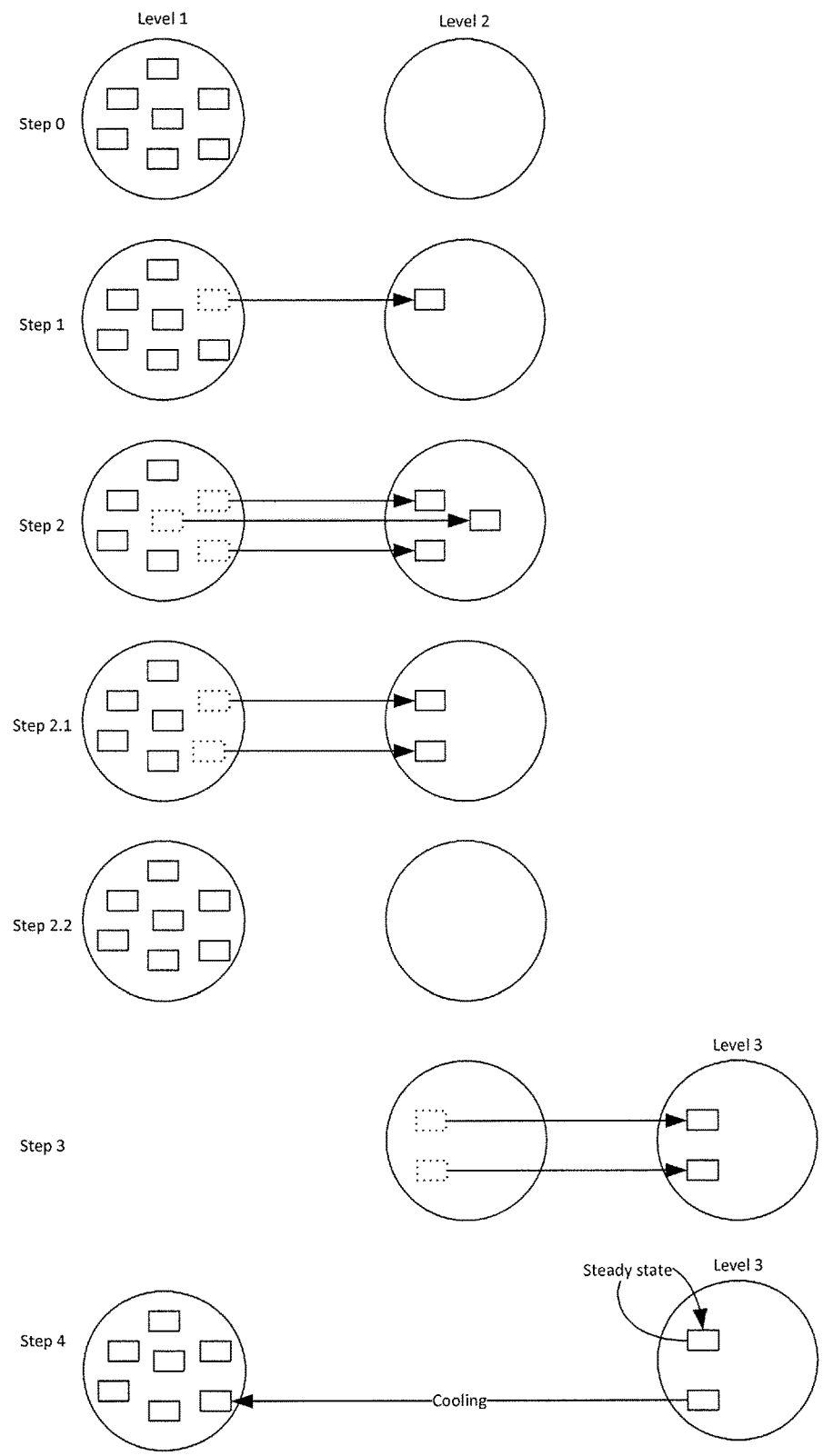
FIG. 6 is a diagram illustrating steps in a method of an embodiment for reducing read disturb errors.

Returning to the drawings, FIGS. 4 and 5 are flow chart 400, 500 of a method of an embodiment for reducing read disturb errors and will be discussed in conjunction with the diagrams in FIGS. 6 and 7. The acts in this method can be performed by any suitable component in the memory system 100. For example, in one embodiment, the method steps are implemented in the controller 102 generally, while, in another embodiment, the method steps are implemented in the read disturb module. As shown in FIG. 4, in this method, the memory system 100 initializes and uses a read disturb detection technique (such as, but not limited to, one of the three techniques discussed above) to find the blocks in the first level that contain a read disturb error (act 410). At some point, the read disturb detection technique identifies a block that has a read disturb error and needs to be scrubbed (act 420). Optionally, if the aggressor word line is known, the memory system 100 can check adjacent codewords for a sequential pattern, as the word lines containing those codewords might also be aggressors (e.g., when the codewords are part of data that is frequently read) (act 430). For example, the memory system 100 can check both the physical metapage neighbor(s) and the logical address neighbors, which may not have been stored physically adjacent.

The memory system 100 then scrubs the block(s) that are designated by the read disturb detection technique (act 440). This is shown diagrammatically in Steps 0 and 1 in FIG. 6, where data stored in a level one block is moved to a level two block (after the move, the source block can be erased and placed into a pool of available level one blocks). As mentioned above, the level one block can be an MLC block, while the level two block can be an SLC block, which can aid in endurance during the tracking process discussed below. Next, a tracking process is started on relocated data in the level two block (act 450). This act will be discussed in more detail below in conjunction with the flow chart 500 in FIG. 5.

The memory system 100 continues with the read disturb detection process for the other blocks (act 460), with the above acts repeated for other blocks. As illustrated in Step 2 in FIG. 6, this can result in more data being moved from level one blocks to level two blocks. As discussed above, level two blocks may be a limited resource in the memory system 100 because of the limited number of read counters. So, it is possible that there are more blocks that have read disturb errors than available level two blocks to scrub the data in. In this situation where there may be a "flood" of data into level two blocks, the memory system 100 can implement "flood control" techniques. For example, the memory system 100 can evaluate the existing blocks for eviction and preemption. As another example (shown in Step 2.1 in FIG. 6), the memory system 100 can employ a trickle technique, in which a limited number of blocks are let into level two over a given time period to help ensure that flooding does not take place. As yet another example (shown in Step 2.2 in FIG. 6), instead of using a preemption technique, level two can be completely closed to prevent any blocks from entering, thereby rejecting the flood.

As mentioned above, when data is moved into a level two block after a scrubbing operation, a tracking process is performed on the data (act 450). This tracking process will now be discussed in more detail in conjunction with the flow chart 500 in FIG. 5. As shown in FIG. 5, the memory system 100 allocates (e.g., via a Flash translation layer (FTL) table) a large volume of read counters (more than in the level one blocks) to track each "unit" read from the level two block (act 510). (In one embodiment, the values of the counters are stored in non-volatile memory periodically to safeguard against power loss.) Whereas a read counter in a level one block may be directed to the entire block, so a read of any part of the block is registered by the counter, a read counter in a level two block is of a finer granularity. For example, the "unit" that is being tracked by the read counter can a ECC page (a codeword) or the host request size. For every unit that is read, the associated counter is incremented (act 520), and the memory system 100 determines if the counter is greater than a threshold (e.g., 80% of the maximum read count of the block) (act 530). When the counter is greater than the threshold, the memory system 100 determines that the threshold has been reached (act 540).

The above steps will be referred to as "path 1" in the flowchart 400. In "path 2" in the flowchart 400, the memory system 100 then determines that a consolidation closure is needed because of an elapsed window or because several new processes were spawned (act 580). Then, the memory system 100 closes the process because of other factors, such as, but not limited to, time or traffic changes (act 590).

Next, the memory system 100 evaluates all level two counters for other outliers that can be considered exceptionally high (act 550). There are several possible conditions at this point. In path 1, there can be small fragments of hot read data in the block with no other outliers, the entire block can be hot, or there can be several fragments of hot read data in the block (i.e., other hot read outliers may exist, but they may have not reached the threshold). In path 2, level two tracking can close prematurely. If path 2 was taken because of time, then the block can be considered cool, or the threshold may not have been reached. Also, if path 2 was taken because multiple level two processes were spawned in a short time window, the hot read zone may be considered to be sufficiently large. That is, if multiple sessions are spawned within a short window of time, the memory system 100 can use an additional set of counters until exhausted (e.g., keep spawning level until there is no more space in level two, and then do flood control). If all the sets have been exhausted and the evaluation window for the oldest tracked relocation is considered large enough (e.g., defined by total device reads), the memory system 100 can move to the closure step and then allow the newly-spawned process to repurpose the counters (e.g., erase and allocate).

Figure 7:
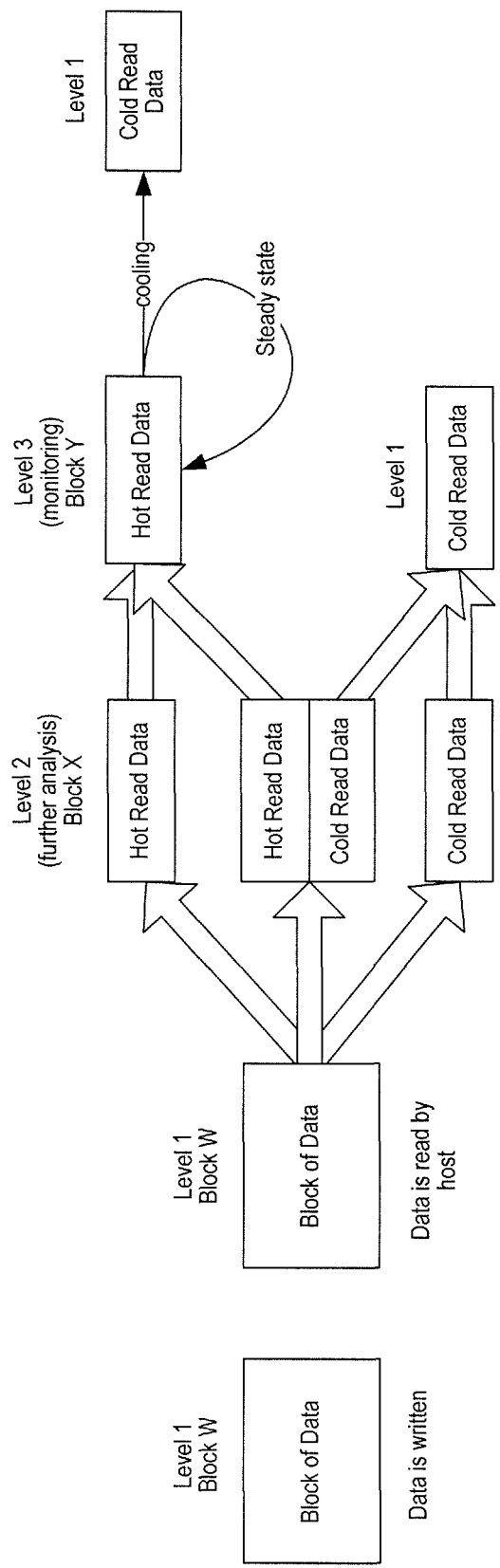
FIG. 7 is a diagram illustrating data flow in a method of an embodiment for reducing read disturb errors.

FIG. 7 illustrates an example of the method discussed above. As shown in FIG. 7, data is written into block W, which is a level one block. When the memory system 100 determines that a read disturb error occurred in block W (e.g., using one of the three read disturb error detection techniques discussed above or some other techniques), the memory system 100 moves the data from block W to a block X, which is a level two block. Block W is then erased and placed back into the level one pool to be used later when a level one block is needed. Because block X is a level two block, there are more read counters associated with that block than block W (because block W is a level one block). For example, in one embodiment, a read counter can be assigned to every smallest read unit (e.g., an ECC page) in the block. Of course, a different level of granularity can be used.

By using many read counters, the memory system 100 can determine how often data/areas of the block are being read to identify the data that is causing the read disturb problem by virtue of being read so often. In one embodiment, the memory system 100 compares to the value of the read counters to one or more thresholds to determine if the data stored in the block is "hot" or "cold." As used herein, "hot read data" (or "hot data") refers to frequently-read data (e.g., a photo that has "gone viral" on social media), and "cold read data" (or "cold data") refers to infrequently-read data (e.g., achieved data). Although the terms "hot" and "cold" are used in these phrases, "hot" and "cold" do not refer to actual temperature in this context, but rather to the relative frequency at which the data is read.

As shown in FIG. 7, there are three possibilities of this analysis: the block can store all cold read data, all hot read data, or a mixture of cold and hot read data. If the block contains all cold read data, it is probable that there was a misdetection of a read disturb error or whatever read conditions caused the read disturb error are no longer present, so the data can be moved back to any level one block (not necessarily the level one block (block W) that it came from), and block X can be made available to analyze the read patterns of other data. If the block contains all hot read data, the read conditions that caused the read disturb error are still present, and a read disturb error will likely occur if the data is copied back to a level one block. So, instead, the data is copied to a level three block (see also Step 3 in FIG. 6). If the block contains a mixture of cold and hot read data, the cold and hot data can be separated, with the cold data being copied back to a level one and the hot data being copied to a level three block. Splitting of data by hot/cold type does not necessarily need to occur immediately but instead can be by suggestion on the next scrub/compaction exercise or enough hot data is collected to deem it acceptable to create a hot read block. This avoids leaving the hot read block open, as incomplete write blocks are more susceptible to read disturbs. The memory system 100 can log the suggested sort from the level two evaluation and repurpose the read counters for another evaluation.

Figures 8A, 8B:
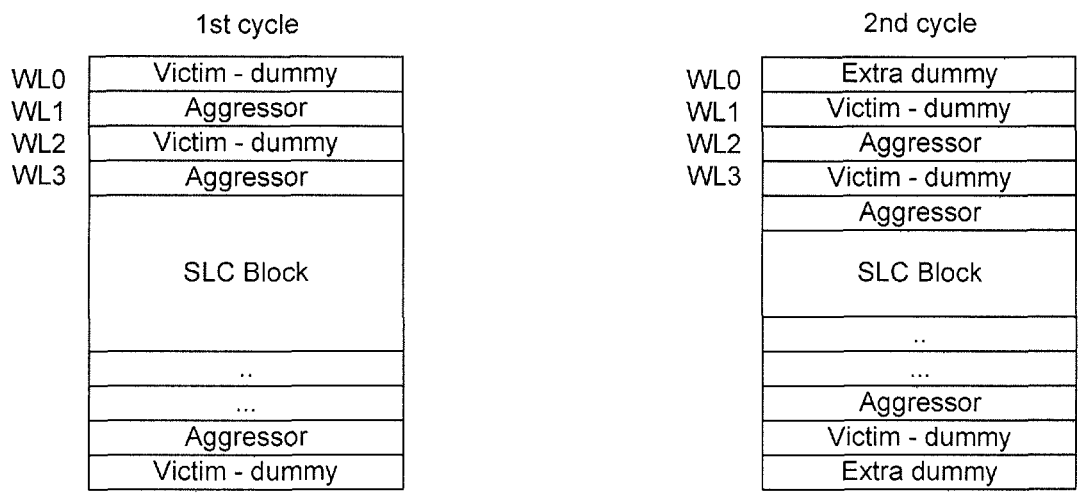
FIG. 8A is a diagram illustrating a first cycle of a read-persistent block of an embodiment.
FIG. 8B is a diagram illustrating a second cycle of a read-persistent block of an embodiment.
Figure 9:
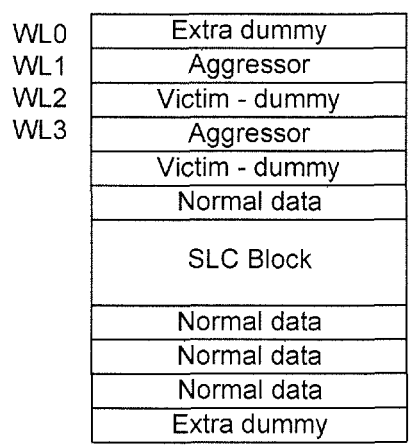
FIG. 9 is a diagram illustrating a read-persistent hybrid block of an embodiment.

The reason the hot data is copied from the level two block to the level three block (instead of back to the level one block) is because reads to a level three block are less likely to cause read disturb errors than reads to a level one block. There are several ways in which a level three block can provide this characteristic. For example, a level three block can be an SLC block, which has a higher read endurance that an MLC block, which would be typically used as level one blocks. As another example, "dummy data" can be stored in the adjacent word line(s) surrounding the aggressor word line, and read data can be stored farther away from the aggressor. In this way, even if a read disturb error is created, it would not harm the other data stored in the block. This "dummy data" technique can be used with SLC or MLC (or other) blocks. Other alternatives can be used as well. For example, as shown in FIGS. 8A and 8B, in addition to dummy data surrounding the aggressor word lines in an SLC block, additional dummy word lines can be added in future cycles to make the block more read persistent. As another example, a read-persistent hybrid block can be used (see FIG. 9), in which part of an SLC block is used to store data in aggressor word lines surrounded by dummy data, and another part of the SLC block is used to store normal data. These blocks can survive more reads and therefore use a different set of read thresholds. In an alternate embodiment, only the colder/coldest written data are placed into evaluation to avoid the latest written (hot write) data which is already slated to go through some level of compaction/filtering. So, in this alternative, the level two tracking is only spawned when a block has not been written recently, as if a block is refreshed (hot write data), the refresh operation cures the read disturb problem. In yet another alternative, the memory system 100 can replicate data in the neighbors to reduce the disturb effects and to provide added redundancy. Also, the memory system 100 can place dummy neighbors in an average offset (average of data set N and N+1) or the C-state to reduce the disturb effects. In every program/erase cycle (or set of cycles) of the block, the data can ping-pong between using offset 0 and +1, so that the valid data sets alternate with the dummy data. In yet another alternative, the level three memory can be RAM, so the data is cached in RAM while it is "cooling off."

When the hot read data is stored in the level three block (block Y in FIG. 7), read counters monitor the read activity of the stored data to detect when the data has "cooled down," and the read activity has reached a steady state below a threshold. Since the reading the data will likely no longer result in a read disturb error, the data is moved from the level three block back to a level one block (although not necessarily the same level one block that initially stored the data). This is shown diagrammatically in Step 4 in FIG. 6. This tracking detects steady state of heated reads or cooling of reads.

Any suitable technique can be used to determine if the data has "cooled" sufficiently. In one exemplary technique, "cooling" can be defined as a single threshold crossing from hot to cold. For example, if the reads cross fifty percent (0.50) of the hot determination, then the block can be considered cool. This design can be used instead of detecting the cooling rate (second level integration) and tracking historical information. For example, if the memory system 100 is looking for data that would be scrubbed every one day (assume 10,000 MLC senses per day to a block would cause a scrub), then rather than tracking the block for a full day, the memory system 100 can use interpolation for a shorter duration evaluation to analyze reads per second. An example of this interpolation is shown in the table in FIG. 10. The memory system 100 can evaluate reads over a short duration where significant evidence suggest that data within the level two evaluation would cause continual scrubbing. If the level two evaluation needs to be terminated due to eviction (preemption) or power down, then the duration can be measured, and the appropriate threshold can be compared (e.g., if the duration is 32 seconds, then 32*1 sec (10K/(24*60*60)). Reads per second can also be evaluated as velocity, so it is possible to detect the heating speed and cooling speed with acceleration models (reads/sec^2). Calculating second level integration to determine acceleration can require at least two or more points of measurement. So, the memory system 100 can measure how quickly the read frequency is going up and down, where exponential acceleration indicates that data is particularly hot.

Another technique that can be used to determine if the data has "cooled" sufficiently is shown in FIG. 11. In this technique, to detect a "hot read cool off," the memory system 100 can calculate a hot zone read divided by the percentage of drive reads over several periods of time.

There are several advantages provided for by these embodiments. For example, by implementing a second level analysis using a temporary set of counters for identifying and separating hot read data from the rest of the written data (i.e., cold or lukewarm cold) for blocks that contain a read disturb error, these embodiments can identify extremely-high reads for special treatment. In this way, these embodiments can identify hot read data and treat the hot read data differently (e.g., placing the hot read data in SLC blocks with no neighbors and placing dummy data in the first and last word lines). This provides particular advantages in memory systems where most of the drive space is "seldom"

read (i.e., not read enough to cause a read disturb). Additionally, these embodiments can split data by read intensity, store highly read-intensive data in SLC blocks in a fashion that increases the endurance, monitor hot read data for cooling, integrate reads over a short time period (measure reads per time period), manage read counters to handle flooding and migrate data to new blocks to avoid open block reads, evaluate colder/coldest written data to avoid mixing hot write and cold/hot read data types (because hot write data may go through a level of compaction and so it is already subject to a refresh from read disturbs, place hot read data in SLC to increase read performance, separate out hot read and cold read data to increase endurance, store data uniquely in SLC blocks to help avoid read disturbs especially for hot read data, and measure the rate of changes of reads per time to approximate the way data may be heating up.

Figure 12:
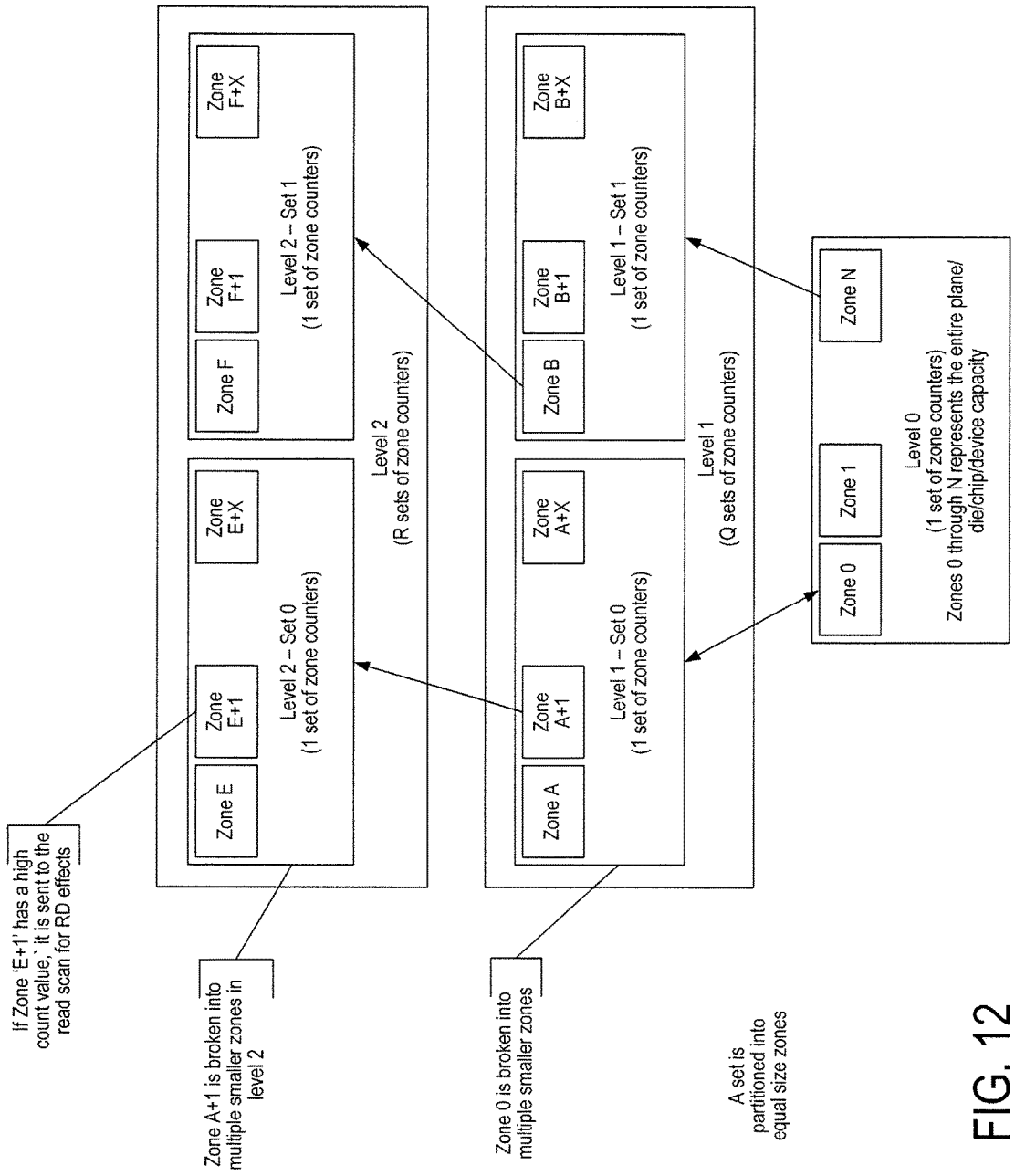
FIGS. 12 and 13 are diagrams showing how read counters can be used in an embodiment.
Figure 13:
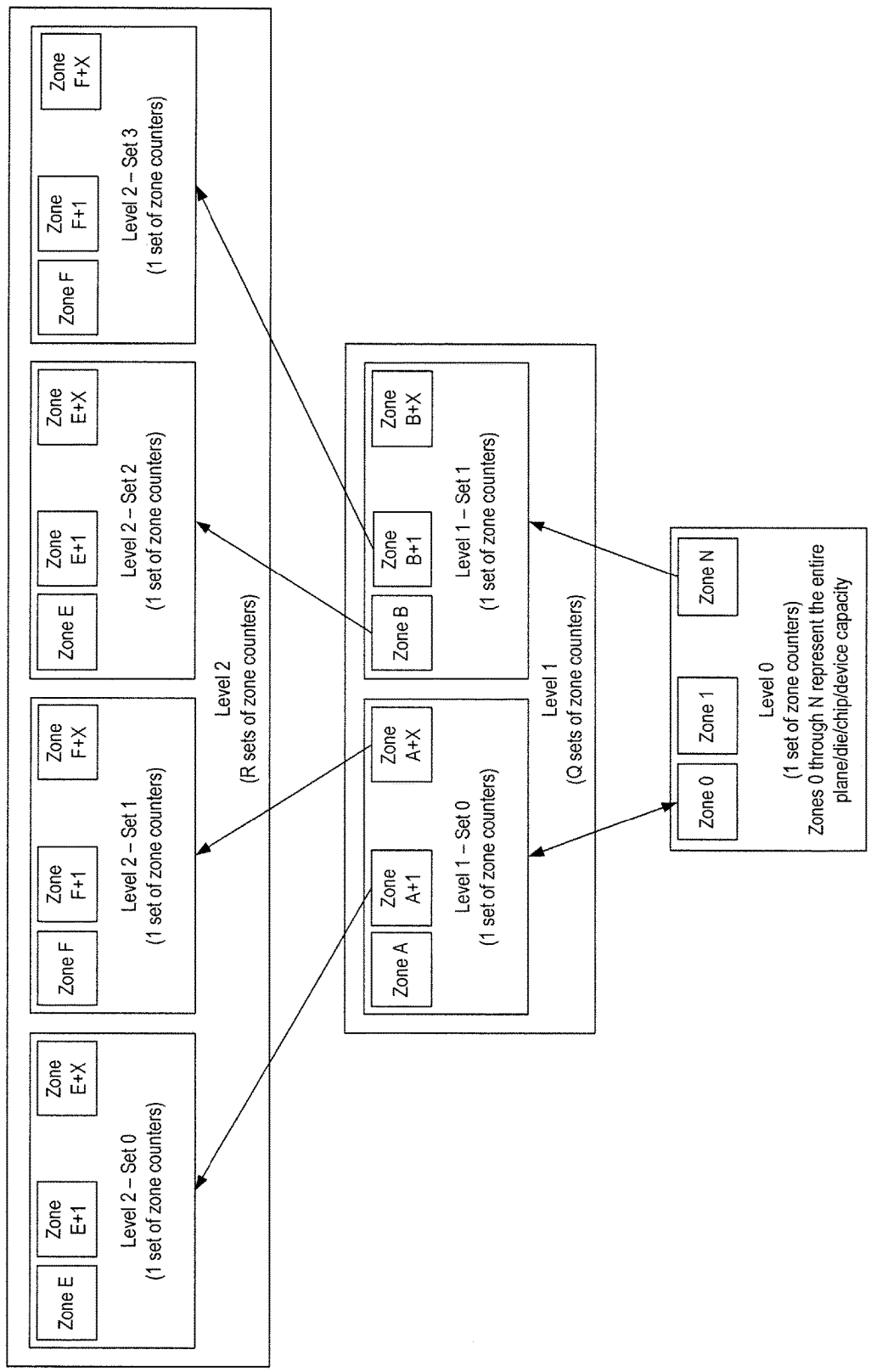

As discussed above, level two and level three blocks have read counters assigned to them to detect the "read temperature" of data. The following paragraphs (and FIGS. 12 and 13) provide one particular implementation of the use of read counters. Of course, other implementations can be used.

In one embodiment, a hash tree is used to track read zones and find hot read areas of the memory. The hash tree uses a small footprint of memory area can provide more accuracy than a simple block counter depending on the tree's design level. The hash tree can help isolate regions of the memory that the host is reading. The tree can be designed to be tall or short. With more branches or more singularity, the tree can be symmetrical or asymmetrical.

In one implementation, when the tree starts, only one level is be used (level 0). (Here, "level" refers to a level in the tree—not to the block level discussed above). Level 0 is a single set of N 4-byte counters. As a zone is hit by reads, the read counter is incremented. When the zone reaches a certain threshold, the zone is elevated to level one. (The threshold to elevate may need to be modified as the tree fills up.) When the zone is elevated to level one, its space is broken into further zones in level one. This provides more accuracy in detecting the hot space of a zone. A pointer is used to indicate which zones have elevated. After a zone is elevated, its root still increments to help keep track of its read count.

The elevation of the zones can continue up the tree. Each level hash can have one or more children nodes. Because space is limited in an embedded device, when a different zone in a lower node becomes hotter, an eviction can take place if the tree cannot grow without bounds. When the eviction happens, the zone is collapsed down, and a new zone is elevated in the tree for more analysis. During an eviction, the zone read count is still preserved, but the tree information may be lost. As zones reach the tree tips and reach the highest threshold, the zone can be placed on a read patrol list for further evaluation for read scrub. Periodically, the tree and its parameters can be saved to the non-volatile memory. Then, on power upon the table can be loaded from non-volatile memory to RAM.

To avoid counter saturation, the tree can be pruned back by some amount periodically. The pruning can occur with block erases, hot read data migration, and alternatively when certain hot count milestones are reached. Using the assumption that device is evenly wear leveled (and the tracking migrates data to avoid data retention issues), all the blocks in the system can vary in hot count by no more than X%. Using this knowledge, certain hot count checkpoints can be established to prune down the tree. The pruning of the tree can be a global reset, or pairing the counters by a percentage, or pairing the tree by a fixed amount. The tree can be pruned whenever the stem threshold is crossed (causing a block/word line to reach the scrub list).

When an area is detected hot, the hot area (and its neighbor word lines) can either be refreshed to a new block (leaving the rest of the block intact), or the whole block can be scrubbed. The hot data can either be refreshed to a separate zone to not trip the tree up as the reads continue, or it can just migrate naturally. If migrating naturally, nothing special may need to be done in the event that a hot read zone becomes cold.

After a zone is detected hot, and the neighbors are checked and scrubbed, the hot data can be tracked logically using a separate table. Tracking the data separately can provide the advantage of detecting when the data becomes cold and can help from having the same data trigger branching in the tree after scrubbing. The hot data would still need to be tracked for future read disturbs.

If the tree is used to track the device physically and an erase occurs within a zone, the read counters can be rolled back by a defined amount to account for the fact that a portion of that zone has been refreshed. A branch of the tree can represent a group (e.g., 4 KB), a die's word line, a series of word lines, or a series of blocks. If erases occur on units of blocks, the branch that represents that block may need to collapse down to the block level, if necessary. At the time of collapse, a new branch can be elevated or the elevation can occur on the next read to that set. An alternative design is to have the tree track the addresses logically instead of physically, where any writes to a zone/branch can have a decrementing effect on the counters. For read patrol, the system can be coupled with the design that reads neighbor pages and then use lower root values for patrol areas. Alternatively, read patrol can patrol the top nodes in the tree as a first step.

Finally, as mentioned above, any suitable type of memory can be used. Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A memory system comprising:
    a memory comprising a plurality of blocks; and
    a controller in communication with the memory, wherein the controller is configured to:
        determine that there is a read disturb error in a block;
        identify which data in the block caused the read disturb error to occur in other data in the block; and
        relocate the data that caused the read disturb error to another block with a higher read endurance than the block currently storing the data, wherein the another block with the higher read endurance is less susceptible to read disturb errors than the block currently storing the data.

2. The memory system of claim 1, wherein the controller is further configured to relocate the data to a block with a lower read endurance after the data is determined to be less likely to cause a read disturb error when read.

3. The memory system of claim 1, wherein the read disturb error is determined using a read counter.

4. The memory system of claim 1, wherein the read disturb error is determined using a read-patrol technique.

5. The memory system of claim 1, wherein the read disturb error is determined by reading neighboring word lines when reading a word line.

6. The memory system of claim 1, wherein the controller is configured to identify data in the block that is causing the read disturb error using read counters.

7. The memory system of claim 1, wherein the block with the higher read endurance comprises SLC memory cells, and wherein the block in which the read disturb error was determined comprises MLC memory cells.

8. The memory system of claim 1, wherein the block with the higher read endurance comprises volatile memory, and wherein the block in which the read disturb error was determined comprises non-volatile memory.

9. The memory system of claim 1, wherein the block with the higher read endurance stores dummy data in word lines surrounding the word lines that store the data.

10. The memory system of claim 1, wherein the memory is a three-dimensional memory.

11. The memory system of claim 1, wherein the memory system is embedded in a host.

12. The memory system of claim 1, wherein the memory system is removably connected to a host.

13. A memory system comprising:
a memory comprising a plurality of blocks;
a plurality of read counters; and
a read disturb module in communication with the memory and the plurality of read counters, wherein the read disturb module is configured to:
sense a read disturb error in a first block;
copy data from the first block to a second block;
assign read counters to the second block to identify hot read data;
copy the hot read data from the second block to a third block, wherein the third block is less susceptible to read disturb errors than the first block;
assign read counters to the third block to determine when the hot read data becomes cold read data; and
copy the cold read data from the third block to another block.

14. The memory system of claim 13, wherein the read disturb module is configured to sense read disturb errors using a read counter.

15. The memory system of claim 13, wherein the read disturb module is configured to sense read disturb errors using a read-patrol technique.

16. The memory system of claim 13, wherein the read disturb module is configured to sense read disturb errors by reading neighboring word lines when reading a word line.

17. The memory system of claim 13, wherein the third block has a higher read endurance than the first block.

18. The memory system of claim 13, wherein the first block comprises MLC memory cells, and wherein the third block comprises SLC memory cells.

19. The memory system of claim 13, wherein the first block comprises non-volatile memory, and wherein the third block comprises volatile memory.

20. The memory system of claim 13, wherein the third block stores dummy data in word lines surrounding the word lines that store the data.

21. The memory system of claim 13, wherein the memory is a three-dimensional memory.

22. The memory system of claim 13, wherein the memory system is embedded in a host.

23. The memory system of claim 13, wherein the memory system is removably connected to a host.

24. The memory system of claim 13, wherein hot read data becomes cold read data when reading the hot read data will no longer result in a read disturb error.

25. The memory system of claim 13, wherein hot read data becomes cold read data when read activity of the hot read data is below a threshold.

26. The memory system of claim 1, wherein less than all of the data in the block is relocated to the block with the higher read endurance.

27. The memory system of claim 26, wherein only the data that caused the read disturb error is relocated to the block with the higher read endurance.

28. A memory system comprising:
a memory comprising a plurality of blocks; and
means for determining that there is a read disturb error in a block;
means for identifying which data in the block caused the read disturb error to occur in other data in the block; and
means for relocating the data that caused the read disturb error to another block with a higher read endurance than the block currently storing the data, wherein the another block with the higher read endurance is less susceptible to read disturb errors than the block currently storing the data.

29. The memory system of claim 28 further comprising means for relocating the data to a block with a lower read endurance after the data is determined to be less likely to cause a read disturb error when read.

30. The memory system of claim 28, wherein the block with the higher read endurance comprises SLC memory cells, and wherein the block in which the read disturb error was determined comprises MLC memory cells.

* * * * *